US006799709B2

United States Patent
Takaguchi et al.

(10) Patent No.: US 6,799,709 B2
(45) Date of Patent: Oct. 5, 2004

(54) METHOD AND APPARATUS FOR LOCAL APPLICATION OF SOLDER TO PRESELECTED CONDUCTOR AREAS ON A PRINTED CIRCUIT BOARD

(75) Inventors: Akira Takaguchi, Toyama (JP); Masaki Wata, Tokyo (JP); Chikara Numata, Tokyo (JP)

(73) Assignees: Senju Metal Industry Co., Ltd., Tokyo (JP); KTT Co., Ltd., Toyama-ken (JP)

( * ) Notice: Subject to any disclaimer, the term of this patent is extended or adjusted under 35 U.S.C. 154(b) by 43 days.

(21) Appl. No.: 10/321,581

(22) Filed: Dec. 18, 2002

(65) Prior Publication Data

US 2003/0111517 A1 Jun. 19, 2003

(30) Foreign Application Priority Data

Dec. 18, 2001 (JP) .......................... 2001-384362

(51) Int. Cl.$^7$ .............................................. B23K 37/00
(52) U.S. Cl. ......................... 228/4.1; 228/43; 228/49.5
(58) Field of Search .............................. 228/180.1, 43, 228/4.1, 37, 49.5, 207, 212, 223, 260; 269/903; 198/817; 118/423

(56) References Cited

U.S. PATENT DOCUMENTS 4,512,508 A  *  4/1985  Pachschwoll ............ 228/180.1
4,709,846 A  * 12/1987  Eidenberg .................... 228/34
5,186,377 A  *  2/1993  Rawson et al. .............. 228/37
6,119,915 A  *  9/2000  Thompson, Sr. ............. 228/37
6,145,733 A  * 11/2000  Streckfuss et al. ....... 228/180.1
6,237,832 B1 *  5/2001  Chung ....................... 228/44.7

* cited by examiner

Primary Examiner—Tom Dunn
Assistant Examiner—Jonathan Johnson
(74) Attorney, Agent, or Firm—Wenderoth, Lind & Ponack, L.L.P.

(57) ABSTRACT

An apparatus for locally applying solder to a plurality of sets of preselected conductive areas on each printed circuit board to which component leads are joined. The apparatus includes a flux station with flux nozzles, a preheater station, and a wave solder station with solder nozzles, arranged in line to receive and process printed circuit boards. The flux nozzles and the solder nozzles are arranged in a pattern identical to that of the preselected conductive areas on each of the board. A conveyor system is arranged to simultaneously transporting the boards from one station to another. The conveyor system includes a frame, an arm carriage reciprocably moved along the frame, a plurality of pairs of pivot arms pivotably connected to the arm carriage and movable between an inoperative position where the pivot arms are disengaged from the boards and an operative position where the pivot arms are engaged with the boards, a pair of first rails connected to the frame and located above the flux station and the preheater station, and a pair of second rails connected to the frame and located above the wave solder station.

7 Claims, 8 Drawing Sheets

METHOD AND APPARATUS FOR LOCAL APPLICATION OF SOLDER TO PRESELECTED CONDUCTOR AREAS ON A PRINTED CIRCUIT BOARD

BACKGROUND OF THE INVENTION

The present invention relates to a method and apparatus for wave soldering printed circuit boards wherein a solder coating is applied only where needed.

A usual wave soldering apparatus includes a pair of endless chain conveyors driven to advance a printed circuit board at a constant speed from the entrance to exit ends of the apparatus. With the printed circuit board held by gripping fingers, the board is first carried to a fluxer where a foam or spray of flux is applied to the underside of the board. The printed circuit board is then carried over preheaters where the temperature of each board is elevated to approximately 110° C. to 130° C. so as to evaporate excess flux solvent, activate the flux and minimize thermal shock to the printed circuit board. After the printed circuit board is brought to such a preheat temperature, the board is passed over a solder reservoir to receive solder. The board is finally transported to a cool down zone where the solder is cooled to solidify.

Typically, pin grid alley modules and dual in-line packages are loaded onto one side of a printed circuit board, with their terminals or leads projecting downwardly through apertures in the printed circuit board. To increase packaging density, a number of surface mounted devices and connectors are loaded onto the other side of the printed circuit board. Problems have arisen from wave soldering such a printed circuit board. Too much heat occurs on the underside of the board, when contacted with a solder wave, and tends to damage such surface mounted devices and connectors.

Attempts have been made to locally apply solder to preselected conductor areas on a printed circuit board, but not to those areas where surface mounted devices and connectors are mounted. In one known process, flux is locally spayed onto preselected conductor areas on a printed circuit board. The fluxed board is then preheated by a stream of warm gas to evaporate flux solvent. Thereafter, the board is positioned over a plurality of solder wave nozzles arranged within a solder reservoir. At this time, the solder wave nozzles are brought into alignment with a plurality of sets of preselected areas on the printed circuit board. A pump is arranged within the solder reservoir to force heated molten solder to flow upwardly through the solder wave nozzles so as to form solder waves. The preselected areas on the printed circuit board are contacted with the respective solder waves to make soldered joints.

This known process has proven to be effective for eliminating heat damage to sensitive electronic components such as surface mounted devices, but is unable to provide a high degree of productivity since all the steps involved in this process must be manually carried out on a batch basis.

Accordingly, it is an object of the present invention to provide a method and apparatus for locally applying solder to preselected conductor areas on a printed circuit board on a fully automated basis.

SUMMARY OF THE INVENTION

According to one aspect of the present invention, there is provided a method for locally applying solder to preselected conductive areas on each printed circuit board. A first printed circuit board is loaded onto a pair of first rails located above a flux station. The flux station includes a plurality of flux nozzles arranged in a pattern substantially identical to that of a corresponding plurality of sets of preselected conductive areas on the first printed circuit board. The flux nozzles are activated to locally apply flux to the sets of preselected conductive areas on the first printed circuit board. Then, the first printed circuit board is transported from the flux station to a preheater station, and at the same time, a second printed circuit board is loaded onto the first rails. The preheater station is located downstream of the flux station and below the first rails. Thereafter, the preheater station is activated to preheat the first printed circuit board, and the flux nozzles are activated to locally apply flux to a corresponding plurality of sets of preselected conductive areas on the second printed circuit board. The first printed circuit board is removed from the preheater station and then, loaded onto a pair of second rails below which a wave solder station is located, the second printed circuit board is transported from the flux station to the preheater station, and at the same time, a third printed circuit board is loaded onto the first rails above the flux station. The wave solder station is located downstream of the preheater station and includes a plurality of solder nozzles arranged in a pattern substantially identical to that of the sets of preselected conductive areas on the printed circuit boards. The second rails are located downstream of the first rails. The solder nozzles are activated to locally apply solder to the sets of preselected conductive areas on the first printed circuit board, the preheater section is activated to preheat the second printed circuit board, and the flux nozzles are activated to locally apply flux to a plurality of sets of preselected conductive areas on the third printed circuit board.

Preferably, the flux station is moved toward the first rails when the flux is applied. Also, the second rails are moved toward the wave solder station when the solder is applied.

According to another aspect of the present invention, there is provided an apparatus for locally applying solder to a plurality of sets of preselected conductive areas on a printed circuit board. The apparatus comprises a flux station including a plurality of flux nozzles arranged in a pattern substantially identical to that of the respective sets of preselected conductive areas on each of the printed circuit boards for locally applying flux thereto, a preheater station located downstream of the flux station and arranged to preheat the printed circuit boards, and a wave solder station located downstream of the preheater station and including a plurality of solder nozzles arranged to locally apply solder to the respective sets of preselected conductive areas on each of the printed circuit boards. The flux station, the preheater station and the wave solder station are arranged in line in the direction of conveyance of the printed circuit boards. The apparatus further comprises a conveyor system for simultaneously transporting the printed circuit boards from one station to another along a substantially horizontal conveyor path. The conveyor system includes a fixed frame extending in the direction of conveyance of the printed circuit boards, an elongate arm carriage carried by and reciprocably moved along the fixed frame, a plurality of pairs of pivot arms pivotably connected to the arm carriage and movable between an inoperative position where the pivot arms are disengaged from the printed circuit boards and an operative position where the pivot arms are engaged with the printed circuit boards, a pair of first rails connected to the fixed frame and located above the flux station and the preheater station, and a pair of second rails connected to the fixed frame and located above the wave solder station.

Preferably, the preheater station includes a plurality of gas outlets. The flux nozzles, the gas outlets and the solder nozzles are equally spaced from each other by a first distance, and the pivot arms are equally spaced from each other by a second distance substantially equal to the first distance.

The frame preferably includes a horizontally extending connecting member located below the arm carriage and adapted to pivotably connect the pivot arms. The frame further includes an actuator mounted to the arm carriage and operatively connected to one pair of the pivot arms.

The conveyor system further includes an upstream conveyor belt located upstream of the flux station and selectively driven to transport the printed circuit boards, and a downstream conveyor belt located downstream of the wave solder station and selectively driven to transport the printed circuit boards.

Preferably, the first rails are fixedly connected to the frame, and the second rails are movably connected to the frame for movement away and toward the wave solder station.

Preferably, the flux station includes a lifting device adapted to move the flux station toward and away from the first rails.

BRIEF DESCRIPTION OF THE DRAWINGS

The above and other objects, features and advantages of the present invention will become more apparent from a reading of the following description of preferred embodiments when taken in conjunction with the accompanying drawings, in which.

DETAILED DESCRIPTION OF THE INVENTION

Figure 1:
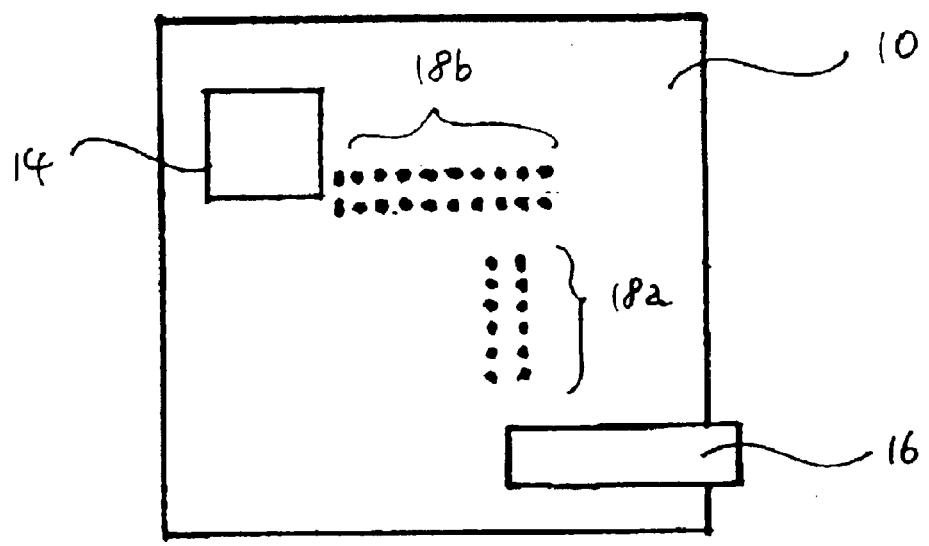
FIG. 1 is a bottom plan view of a printed circuit board with various electronic components loosely mounted or glued thereto.

FIG. 1 is a bottom plan view of a printed circuit board 10. Various electronic components 12 such as a pin grid alley module and a dual in-line package (see FIGS. 4 to 17) are assembled to the printed circuit board 10 by inserting components leads (not seen in FIG. 1) into through holes. Also, a surface mount component 14 and a connector 16 are glued to the underside of the printed circuit board 10. The printed circuit board 10 is formed on its underside with a plurality of sets of preselected conductive areas 18a, 18b to which the component leads are joined by solder.

Figure 2:
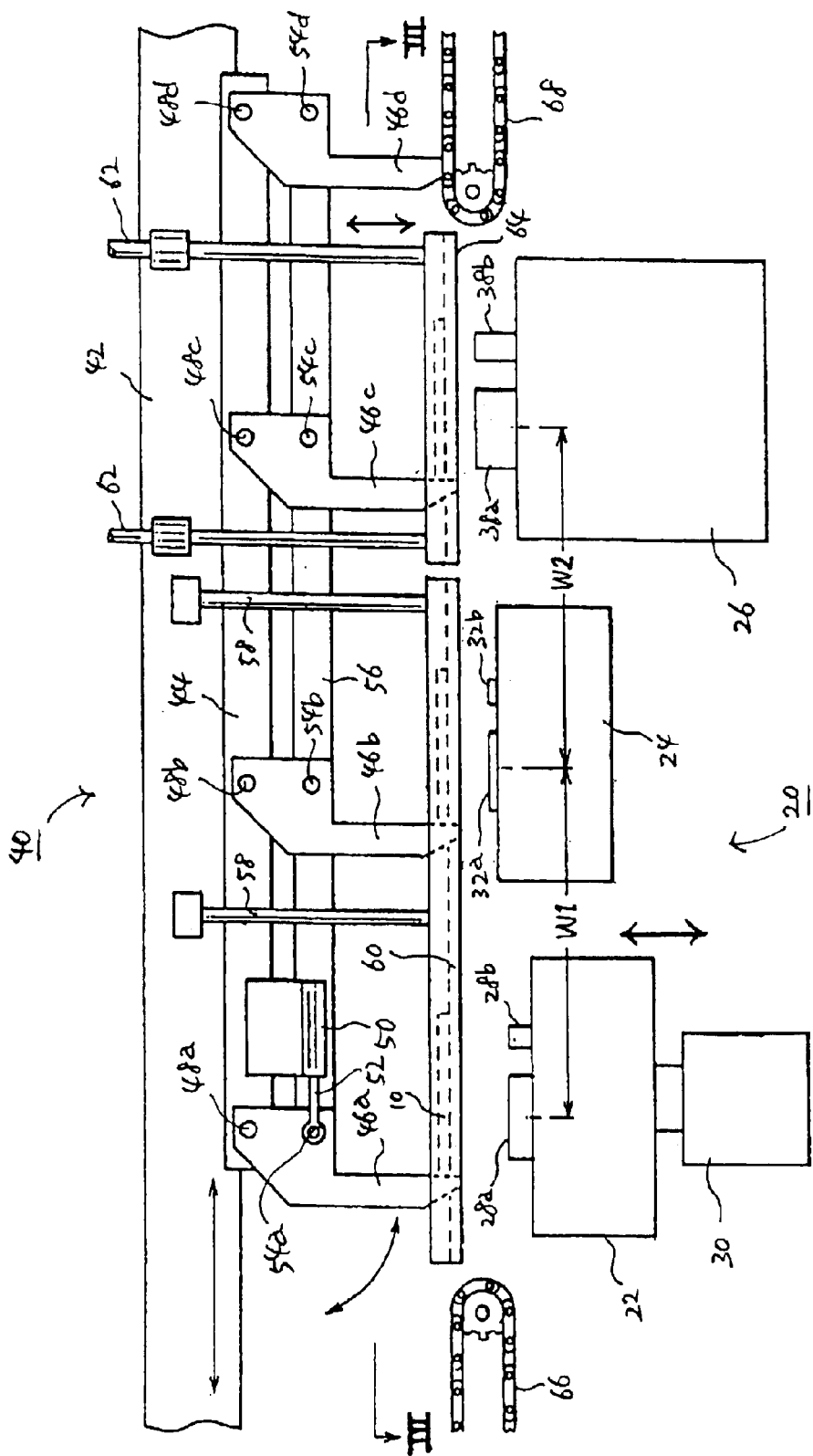
FIG. 2 is a grammatical side view of a wave solder machine according to one embodiment of the present invention.
Figure 3:
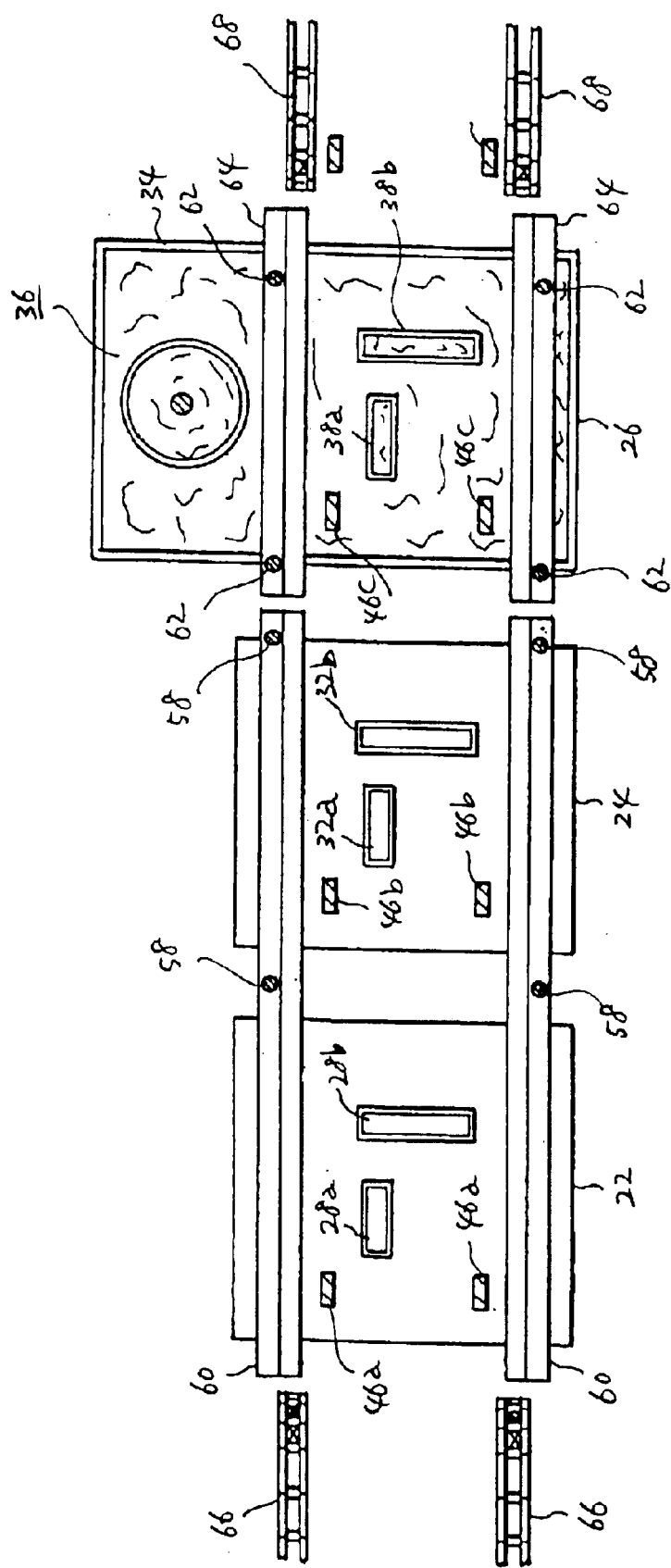
FIG. 3 is a sectional view taken on the line III—III in FIG. 2.

Referring now to FIGS. 2 and 3, there is illustrated a wave solder machine or apparatus, generally designated as at 20, for locally applying solder to the preselected conductive areas 18a, 18b on the printed circuit board 10. The apparatus 20 includes a flux station 22, a preheater station 24 and a wave solder station 26 arranged in line to receive and process the printed circuit board 10.

The flux station 22 includes first and second spray nozzles 28a, 28b communicated with a supply of flux (not shown) and adapted to locally apply flux to the corresponding sets of preselected conductive areas 18a, 18b on the printed circuit board 10. To this end, the first and second spray nozzles 28a, 28b are arranged in a pattern substantially identical to that of the corresponding sets of preselected conductive areas 18a, 18b on the board 10. The flux station 22 is also provided with a lifting device 30 for moving the flux station 22 in a vertical direction.

The preheater station 24 is located downstream of and adjacent to the flux station 22. The preheater station 24 includes a heating element (not shown), and first and second gas outlets 32a, 32b through which a stream of warm gas (see FIG. 9) is directed to the underside of the printed circuit board 10 to flash off the solvents from the flux and to preheat the printed circuit board 10 to minimize thermal shock from contact with solder waves. The first and second gas outlets 32a, 32b are also arranged in a pattern substantially identical to that of the corresponding sets of preselected conductive areas 18a, 18b on the printed circuit board 10.

The wave solder station 26 is located downstream of and adjacent to the preheater station 24. The wave solder station 26 includes a solder reservoir 34 (see FIG. 3) within which a supply of molten solder 36 is held at a predetermined temperature, and first and second solder nozzles 38a, 38b both disposed in the solder reservoir 34. The first and second solder nozzles 38a, 38b are adapted to locally apply solder to the corresponding sets of preselected conductive areas 18a, 18b on the printed circuit board 10. To this end, the first and second solder nozzles 38a, 38b are arranged in a pattern substantially identical to that of the corresponding sets of preselected conductive areas 18a, 18b on the printed circuit board 10.

As shown in FIG. 2, the first spray nozzle 28a and the first gas outlet 32a are spaced from one another by a distance W1. Also, the first gas outlet 32a and the first solder nozzle 38a are spaced from one another by a distance W2. The distance W1 is substantially equal to the distance W2. Similarly, the second spray nozzle 28b and the second gas outlet 32b are spaced from one another by a distance equal to the distance W1, and the second gas outlet 32b and the second solder nozzle 38b are spaced from one another by a distance equal to the distance W2.

The apparatus 20 further includes a conveyor system generally designated by the reference numeral 40 and designed to simultaneously transport a plurality of printed circuit boards from one station to another along a substantially horizontal conveyor path. Specifically, the conveyor system 40 includes a fixed frame 42 extending in the direction of conveyance of the printed circuit board 10. An arm carriage 44 is movably supported by the frame 42. The arm carriage 44 are composed of a pair of elongate plate members reciprocably moved along opposite sides of the frame 40, respectively. Four pairs of pivot arms 46a to 46d are pivotably connected to the arm carriage 44 by respective pivot pins 48a to 48d. The pivot arms 46a to 46d are equally spaced from each other by a distance identical to the distances W1 and W2. Two pneumatic actuators 50 (only one is shown in FIG. 2) are mounted to the arm carriage 44. The pneumatic actuators 50 include respective pistons 52 pivotably connected to the pivot arms 46a through pins 54a to move the pivot arms 46a between an inclined stand-by position and a vertical operative position. In the illustrated embodiment, a pair of elongated connecting members 56 are located below and extend parallel to the arm carriage 44. The connecting members 56 are employed to interconnect the pivot arms 46a to 48d through pins 54a to 54d. Thus, when the pivot arms 46a are pivotably moved by the pneumatic actuators 50, all the other pivot arms 46b to 46d are pivoted in the same manner. Four vertically extending support rods 58, two at each side of the frame 42, depend from the frame 42 to support a pair of parallel fixed rails 60. The fixed rails 60 are located above the flux station 22 and the preheater station 24. Also, four vertically extending support rods 62, two at each side of the frame 42, depend from the frame 42 to support a pair of parallel movable rails 64. The movable rails 64 are located above the wave solder station 26. All the rails 60, 64 have a L-shaped section, although one is a mirror image of the other, and extend in the direction of conveyance of the printed circuit board. During various process steps, the printed circuit board 10 is slidably engaged on and supported between the rails 60, 64. An upstream conveyor belt 66 is arranged upstream of the flux station 22 to transport the printed circuit board 10. Similarly, a downstream conveyor belt 68 is arranged downstream of the wave solder station 26. The surfaces of the conveyor belts 66, 68 on which the board 10 is supported is substantially at the same level as the surfaces of the fixed and movable rails 60, 64 on the board 10 is supported.

Figure 4:
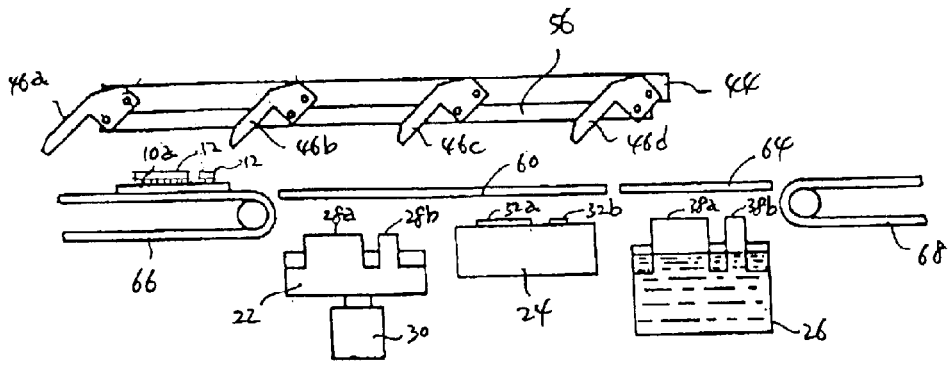
FIGS. 4 to 17 sequentially show how a plurality of printed circuit boards are simultaneously transported from one station to another by a conveyor system shown in FIGS. 2 and 3 and processed at various stations of the wave solder machine.
Figure 5:
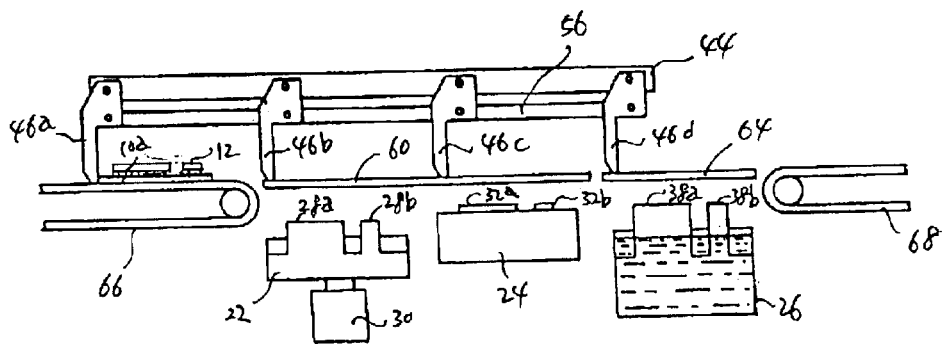

In operation, the upstream conveyor belt 66 is driven to carry a plurality of printed circuit boards along a substantially horizontal conveyor path until one of the boards, designated as at 10a, reaches near the downstream end of the upstream conveyor belt 66. The arm carriage 44 is then moved in an upstream direction (to the left in FIG. 4) with the pivot arms 46a to 46d held in their inoperative or stand-by position as shown in FIG. 4. The pneumatic actuators 50 are activated to move the pivot arms 46a to 46d from their inoperative position to their operative position, as shown in FIG. 5. At this time, the free, lower end of the pivot arms 46a is placed in contact with the upstream end of the printed circuit board 10a. The lower end of the pivot arms 46a to 48d, when the pivot arms are in their operative position, is positioned slightly below the fixed and movable rails 60, 64.

Figure 6:
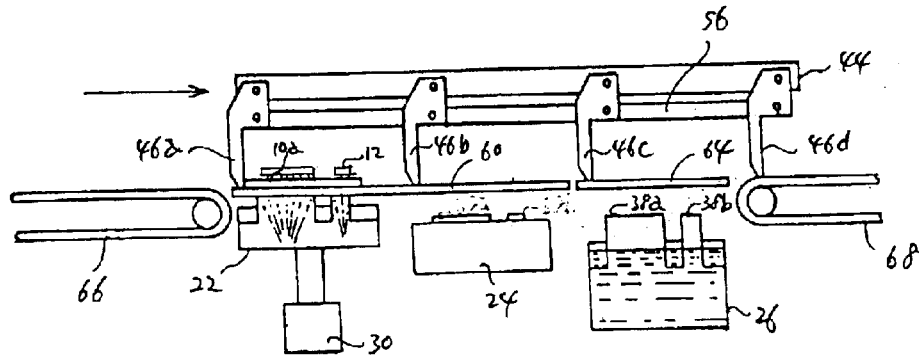

To load the printed circuit board 10a onto the fixed rails 60, the arm carriage 44 is moved in a downstream direction (to the right in FIG. 5). This movement continues until the preselected conductive areas 18a, 18b on the printed circuit board 10a are aligned with the corresponding spray nozzles 28a,28b of the flux station 22. After this alignment is made, the lifting device 30 is driven to lift the flux station 22 to a suitable height. The spray nozzles 28a, 28b are then activated to spray flux locally onto the preselected conductive areas 18a, 18b on the printed circuit board 10, as shown in FIG. 6. After application of the flux is completed, the lifting device 30 is driven to lower the flux station 22 to its initial position.

Figure 7:
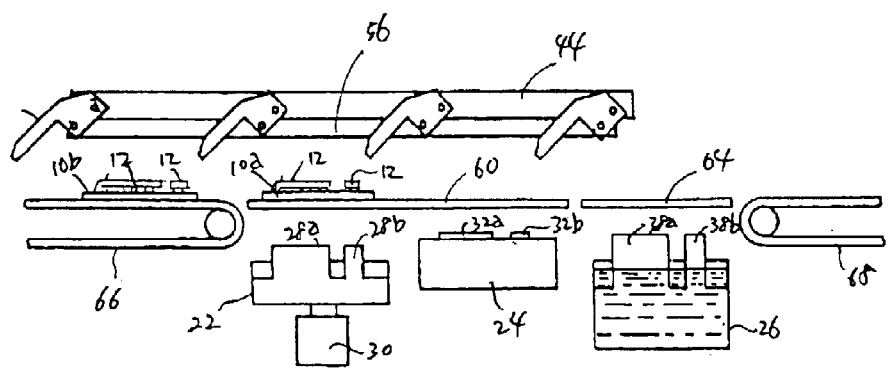
Figure 8:
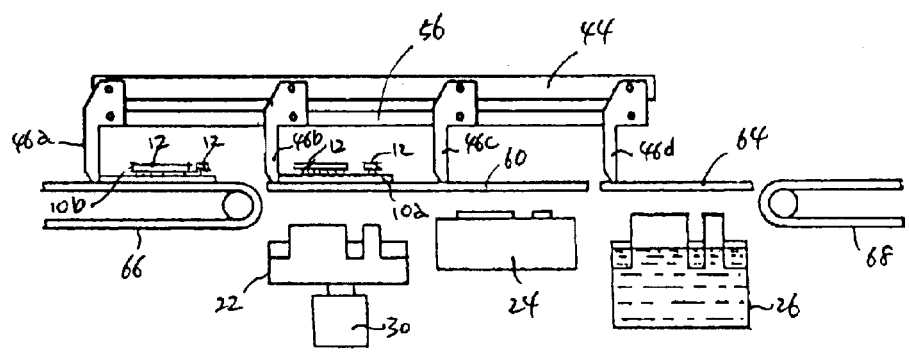
Figure 9:
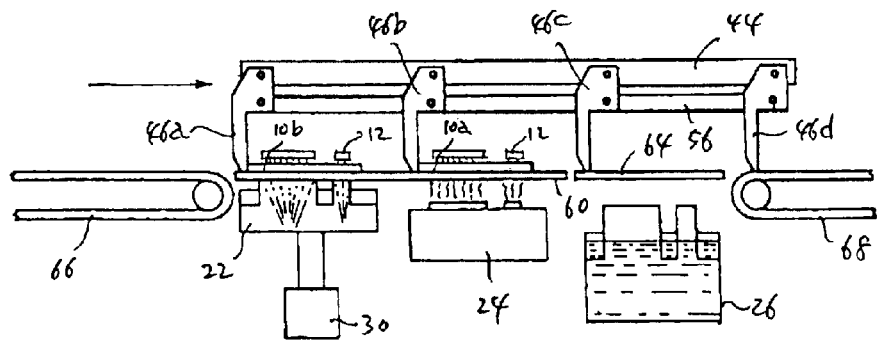

Next, the upstream conveyor belt 66 is again driven to transport a subsequent printed circuit board 10b to near its downstream end. As shown in FIG. 7, the arm carriage 44 is then moved in the downward direction with all the pivot arms 46a to 46d held in their stand-by position. The pneumatic actuators 50 are activated to pivotably move the pivot arms 46a to 46d from their stand-by position to their operative position until the lower end of the pivot arms 46a, 46b is brought into contact with the upstream end of the printed circuit boards 10b, 10a, as shown in FIG. 8. The arm carriage 44 is thereafter driven to transport the printed circuit boards 10b, 10a to the flux and preheater stations 22, 24, respectively. The arm carriage 44 is stopped when the preselected conductive areas 18a, 18b on the boards 10a, 10b are aligned with the gas outlets 32a, 32b and the spray nozzles 28a, 28b, respectivelty. The lifting device 30 is then driven to lift the flux station 22 to a suitable height. As shown in FIG. 9, the spray nozzles 28a, 28b are activated to spay flux onto the preselected conductive areas 18a, 18b on the board 10b while at the same time, a stream of warm gas is fed from the gas outlets 32a, 32b to preheat the preselected conductive areas 18a, 18b on the board 10a to avoid thermal damage to the adjacent surface mount device 14 and the connector 16. The warm gas also allows the board 10a to thermally prepare to contact molten solder with low thermal stress.

Figure 10:
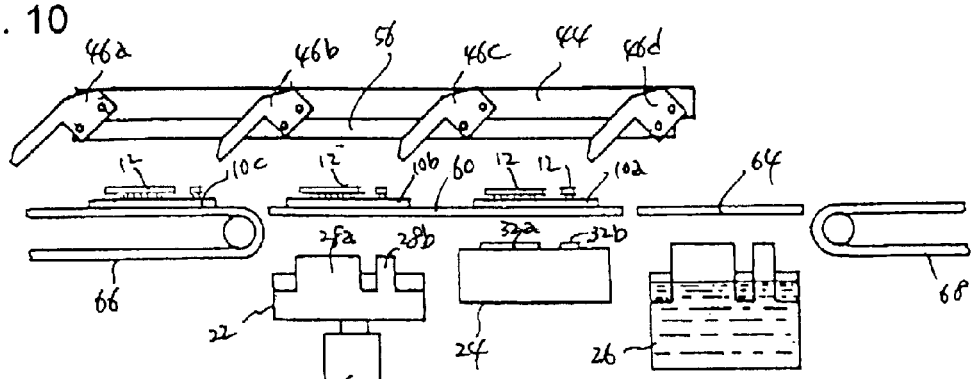
Figure 11:
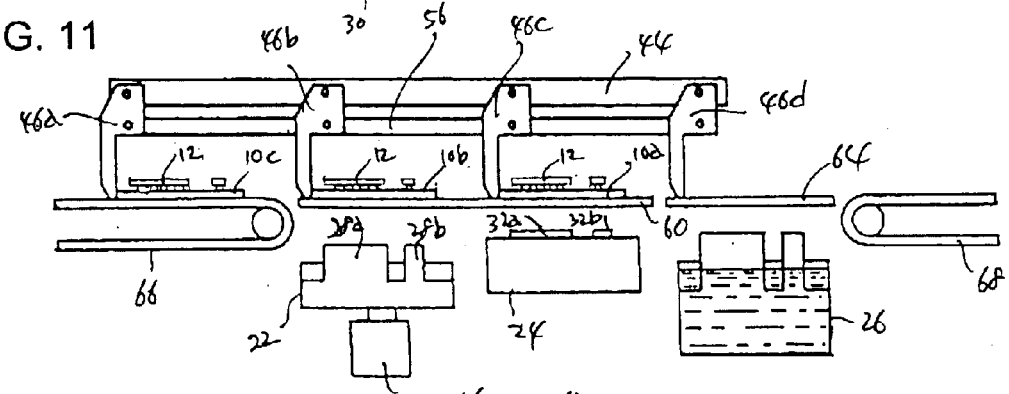
Figure 12:
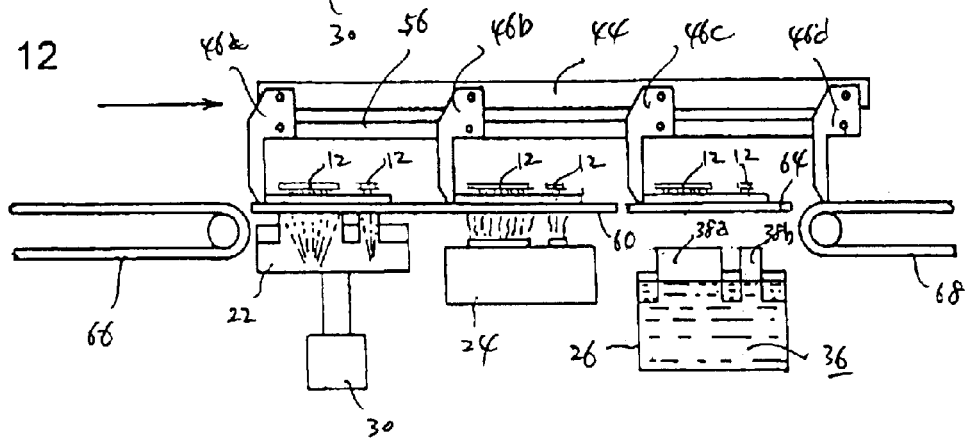

After the flux and preheating processes are complete, the upstream conveyor belt 66 is driven until a printed circuit board 10c reaches near the downstream end of the upstream conveyor belt 66. The arm carriage 44 is then moved in the upstream direction with all the pivot arms 46a to 46d held in their stand-by position as shown in FIG. 10. This movement continues until the pivot arms 46a to 46c are located above the respective printed circuit. The pneumatic actuators 50 are activated to move the pivot arms 46a to 46d from their stand-by position to their operative position until the lower end of the pivot arms 46a to 46c is brought into contact with the upstream end of the respective printed circuit boards, as shown in FIG. 11. The arm carriage 44 is thereafter moved in the downstream direction to load the board 10c onto the fixed rails 60, transport the board 10b from the flux station 22 to the next, preheater station 24, and transport the board 10a from the preheater station 24 to the next, wave solder station 26, as shown in FIG. 12.

Figure 13:
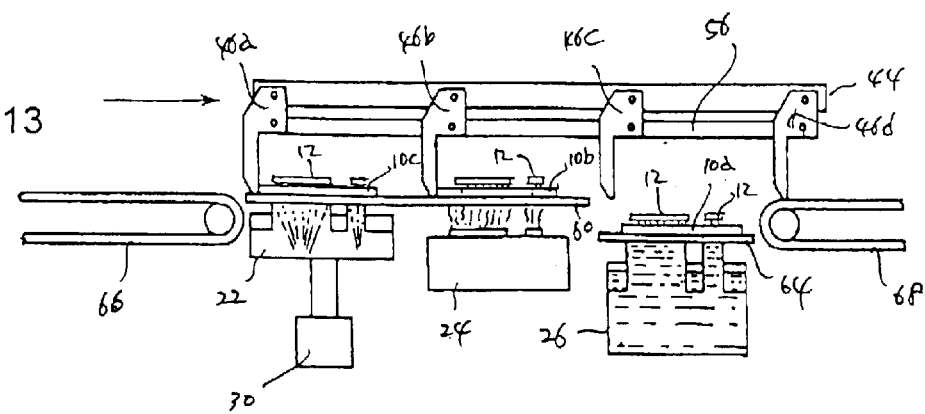
Figure 14:
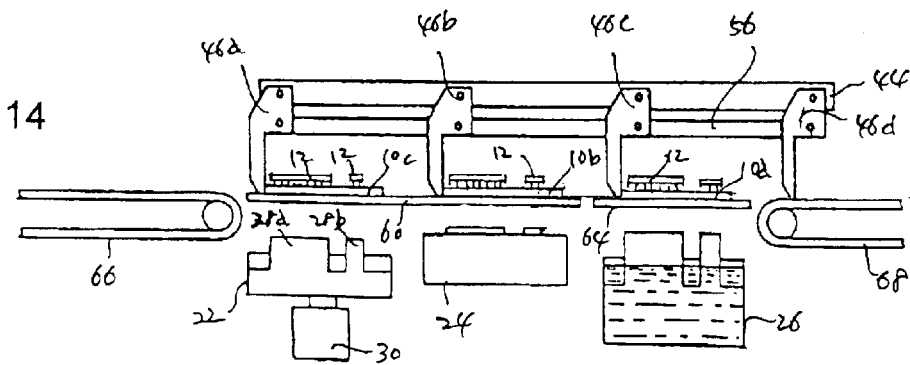

Referring next to FIG. 13, in the flux station, the lifting device 30 is operated to move up the flux station 22 to a suitable height. The spray nozzles 28a, 28b are then activated to spay flux onto the preselected conductive areas 18a, 18b on the board 10c. In the preheater station 26, a stream of warm gas is fed to the preselected conductive areas 18a, 18b on the board 10b from the gas outlets 32a, 32b. In the wave solder station 28, the movable rails 64 are lowered to a position slightly above the wave solder station 26. A solder pump (not shown) is then driven to thereby force molten solder 36 to flow up through the solder nozzles 38a, 38b to form solder waves with which the preselected conductive areas 18a, 18b on the board 10a are contacted.

Figure 15:
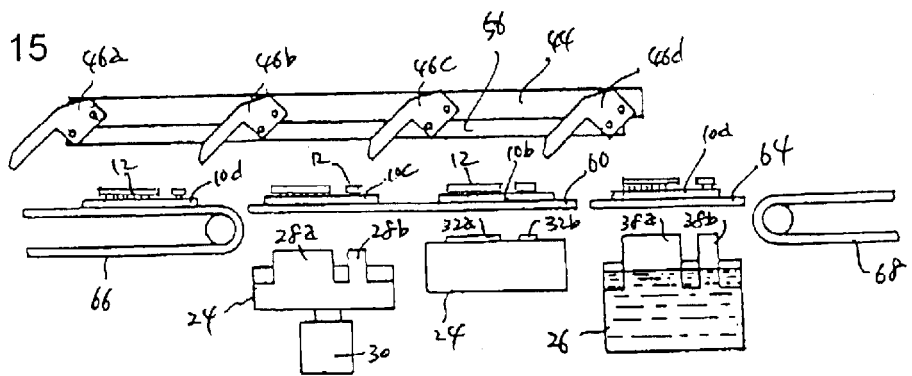
Figure 16:
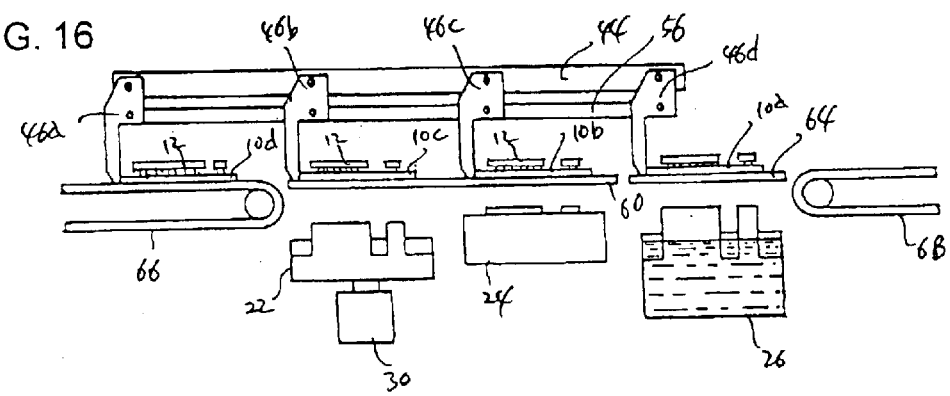
Figure 17:
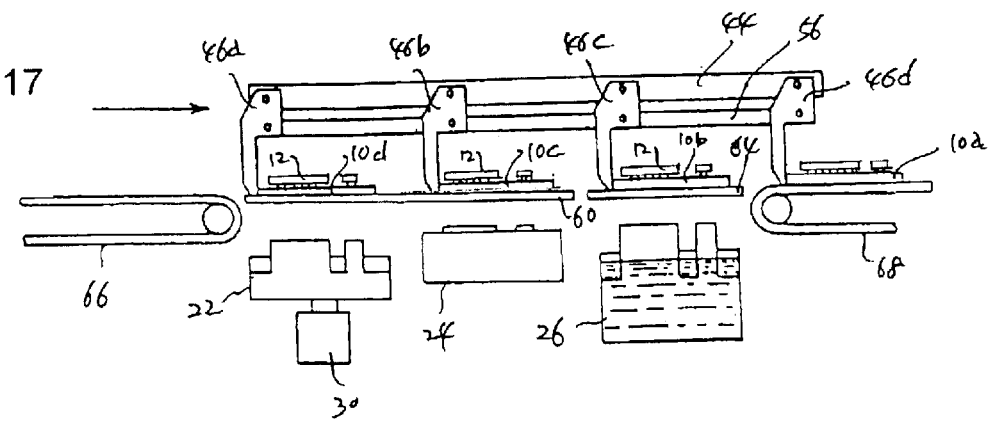

After application of the solder coating onto the preselected conductive areas 18a, 18b on the board 10a, the movable rails 64 (not seen in FIG. 14) are moved up to their initial position. The arm carriage 44 is then moved in the downstream direction with all the pivot arms 46a to 46d held in their stand-by position as shown in FIG. 15. At this time, a next printed circuit board 10d is located at the downstream end of the upstream conveyor belt 66. The pneumatic actuators 50 are thereafter activated to move the pivot arms 46a to 46d from their inoperative position to their operative position until the lower end of the pivot arms 46a to 46d is brought into contact with the upstream end of the printed circuit boards 10a to 10d, as shown in FIG. 16. The arm carriage 44 is then moved in the downstream direction to load the board 10d onto the fixed rails 60, transport the board 10c from the flux station 22 to the preheater station 24, transport the board 10b from the preheater station 24 to the wave solder station 26, and load the board 10a onto the downstream conveyor belt 68 as shown in FIG. 17. Although not shown, after the soldering process is complete, the board 10a is delivered to a cooling station where the board 10a is cooled to thereby solidify the solder.

Although the present invention has been described with respect to its preferred embodiments, it is to be understood that various modifications and changes may be made without departing from the scope of the invention as defined by the appended claims.

What is claimed is:

1. An apparatus for locally applying solder to a plurality of sets of preselected conductive areas on each of printed circuit boards, said apparatus comprising:

a flux station including a plurality of flux nozzles for locally applying flux to the sets of preselected conductive areas on each of the printed circuit boards, said plurality of flux nozzles being arranged in a pattern substantially identical to that of the respective sets of preselected conductive areas on each of the printed circuit boards;

a preheater station located downstream of said flux station and arranged to preheat the printed circuit boards;

a wave solder station located downstream of said preheater station, said wave solder station including a plurality of solder nozzles arranged to locally apply solder to the respective sets of preselected conductive areas on each of the printed circuit boards, said flux station, said preheater station and said wave solder station being arranged in line in the direction of conveyance of the printed circuit boards; and a conveyor system for simultaneously transporting the printed circuit boards from one station to another along a substantially horizontal conveyor path, said conveyor system including a fixed frame extending in the direction of conveyance of the printed circuit boards, an elongate arm carriage carried by and reciprocably moved along said fixed frame, a plurality of pairs of pivot arms pivotably connected to said arm carriage and movable between an inoperative position where said pivot arms are disengaged from the printed circuit boards and an operative position where said pivot arms are engaged with the printed circuit boards, a pair of first rails connected to said fixed frame and located above said flux station and said preheater station, and a pair of second rails connected to said fixed frame and located above said wave solder station.

2. The apparatus of claim 1, wherein said preheater station includes a plurality of gas outlets, said flux nozzles, said gas outlets and said solder nozzles being equally spaced from each other by a first distance, and said pivot arms are equally spaced from each other by a second distance substantially equal to the first distance.

3. The apparatus of claim 1, wherein said frame comprises a horizontally extending connecting member located below said arm carriage and adapted to pivotably connect said pivot arms, said frame further including an actuator mounted to said arm carriage and operatively connected to one pair of said pivot arms.

4. The apparatus of claim 1, wherein said conveyor system further comprises an upstream conveyor belt located upstream of said flux station and selectively driven to transport the printed circuit boards, and a downstream conveyor belt located downstream of said wave solder station and selectively driven to transport the printed circuit boards.

5. The apparatus of claim 1, wherein said first rails are fixedly connected to said frame, and said second rails are movably connected to said frame for movement away and toward said wave solder station.

6. The apparatus of claim 1, wherein said flux station includes a lifting device adapted to move said flux station toward and away from said first rails.

7. The apparatus of claim 1, wherein said pivot arms have an upper end pivotably connected to said arm carriage and a lower end positioned slightly below said first and second rails when said pivot arms are held in their operative position.

* * * * *